United States Patent
de Obaldia et al.

(10) Patent No.: US 7,254,755 B2
(45) Date of Patent: Aug. 7, 2007

(54) ON-CHIP RECEIVER SENSITIVITY TEST MECHANISM

(75) Inventors: Elida Isabel de Obaldia, Dallas, TX (US); Dirk Leipold, Plano, TX (US); Oren Eliezer, Plano, TX (US); Ran Katz, Givataim (IL); Bogdan Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 804 days.

(21) Appl. No.: 10/759,911

(22) Filed: Jan. 16, 2004

(65) Prior Publication Data
US 2004/0148580 A1  Jul. 29, 2004

Related U.S. Application Data

(60) Provisional application No. 60/441,080, filed on Jan. 17, 2003.

(51) Int. Cl.
*H04B 17/00* (2006.01)
(52) U.S. Cl. .................... 714/715; 375/224; 455/226.4
(58) Field of Classification Search ................ 714/715; 375/224; 455/226.1, 226.4
See application file for complete search history.

(56) References Cited

U.S. PATENT DOCUMENTS

| | | | | |
|---|---|---|---|---|
| 5,585,842 A | * | 12/1996 | Chappell et al. ............ 348/192 |
| 5,793,800 A | * | 8/1998 | Jylha et al. .................. 375/219 |
| 6,081,700 A | * | 6/2000 | Salvi et al. .............. 455/193.3 |
| 6,108,525 A | * | 8/2000 | Takemura ................ 455/67.14 |
| 6,330,290 B1 | * | 12/2001 | Glas ........................... 375/324 |
| 6,404,293 B1 | * | 6/2002 | Darabi et al. .................. 331/37 |
| 6,603,810 B1 | * | 8/2003 | Bednekoff et al. .......... 375/228 |
| 6,694,131 B1 | * | 2/2004 | Lakkis ....................... 455/302 |

* cited by examiner

*Primary Examiner*—Stephen M. Baker
(74) *Attorney, Agent, or Firm*—Ronald O. Neerings; Wade James Brady, III; Frederick J. Telecky, Jr.

(57) ABSTRACT

An on-chip receiver sensitivity test mechanism for use in an integrated RF transmitter wherein the transmitter and the receiver share the same oscillator. The mechanism obviates the need to use expensive RF signal generator test equipment with built-in modulation capability and instead permits the use of very low cost external RF test equipment. The invention utilizes circuitry already existing in the transceiver, namely the modulation circuitry and local oscillator, to perform sensitivity testing. The on-chip LO is used to generate the modulated test signal that otherwise would need to be provided by expensive external RF test equipment with modulation capability. The modulated LO signal is mixed with an externally generated unmodulated CW RF signal to generate a modulated signal at IF which is subsequently processed by the remainder of the receiver chain. The recovered data bits are compared using an on-chip BER meter or counter and a BER reading is generated. The BER reading is used either externally or by an on-chip processor or controller to establish a pass/fail indication for the chip.

31 Claims, 4 Drawing Sheets

ON-CHIP RECEIVER SENSITIVITY TEST MECHANISM

REFERENCE TO RELATED APPLICATIONS

This application is based on U.S. Provisional Application Ser. No. 60/441,080, filed Jan. 17, 2003, entitled "Type-II-All-Digital PLL in Deep-Submicron CMOS", incorporated herein by reference in its entirety.

FIELD OF THE INVENTION

The present invention relates to the field of data communications and more particularly relates to an on-chip test mechanism for testing the sensitivity of a receiver suitable for use with single chip digitally implemented radio transceivers such as those constructed according to the Bluetooth or GSM standards.

BACKGROUND OF THE INVENTION

Designing Built-in Test (BIT) or Built-In Self Test (BIST) capabilities into semiconductor devices (i.e. chips) is a well-known technique used to place the circuitry needed to perform critical performance tests directly on the chip rather than off chip. Without the built in test circuitry, external test equipment must be used to perform the various performance tests. Several limitations of using external test equipment include making connections to the on-chip circuitry through a limited number of contact points or pins, requiring expensive test equipment capable of performing RF measurements, and requiring an extended testing time typical of such measurements. On-chip digital or software based mechanisms, which serve to substitute for such external setups, offer significant reduction in testing costs without resulting in a noticeable increase in chip cost.

Manufacturers designing and building products such as communication devices, often design their products to operate in accordance with industry standards. One such standard is the Bluetooth short-range wireless standard. In order to insure conformance with the standard, qualification tests are performed on the products as part of the manufacturing process. Typically, the testing of communication devices requires the device to be connected to one or more pieces of external test equipment that perform a battery of tests to insure compliance with the standard. The test equipment used is typically bulky in size, costly and requires routine maintenance and calibration of its own.

To test radio frequency integrated circuits (RFICs), such as RF transceivers, in a production environment, a dedicated mixed signal tester having RF capabilities is typically required. Such testers, however, are very expensive to obtain and maintain due to calibration and maintenance requirements, etc. The cost of these testers adds significantly to the cost of testing each integrated circuit (IC) which reduces the profit margin of the IC.

Considering the receiver portion of an RF transceiver, the communication standard, or specifications it was designed to target, specifies requirements for the receiver sensitivity. The Bluetooth standard, for example, stipulates that for a Bluetooth modulated RF input signal at −70 dBm power level, the data output of the receiver must have a maximum bit error rate (BER) of $10^{-3}$. Thus, all receivers must be tested for compliance with this figure, or one exceeding it that may have been targeted in the device specification, and those parts failing to meet the sensitivity requirements should be rejected.

A block diagram illustrating an example prior art test scheme for testing the sensitivity of a receiver is shown in FIG. 1. The test scheme, generally referenced 10, comprises the transceiver 12, i.e. the device under test (DUT) and external test equipment including a BER meter 30 and RF generator 26. The transceiver 12 comprises a baseband processor 14 and transmit and receive paths. The transmit path comprises a data shaping circuit 16, shared oscillator 18, power amplifier 19 and T/R switch or combining circuit 20. The receive path comprises a low noise amplifier (LNA) 21, mixer 22 and receiver IF and demodulator 24. Note that the BER meter and RF generator may be combined into a single device.

The baseband processor comprises a user data in port, user data out port, Rx in port and Tx out port. During transmission, the receiver portion is shut down or disabled and the Tx data out is input to the data shaping circuit the output of which modulates the oscillator. The output of the oscillator, which is shared between the transmitter and the receiver, is input to the power amplifier and output through the T/R switch or combiner network to the antenna (not shown). During reception, the received RF signal is input to the LNA. Under normal operation, the RF input signal received from the antenna is a signal modulated in accordance with the particular implementation, e.g., Bluetooth modulation. The output of the LNA is input to one of the two inputs of the mixer. The oscillator is configured to run at the appropriate center frequency without any modulation and the non-modulated oscillator signal is the second input to the mixer. The IF signal output of the mixer is input to the remainder of the receiver chain and the Rx data output is input to the baseband processor.

During testing, the test pattern generator 32 in the BER meter is configured to generate a test sequence which is input to the modulation input of an RF generator with modulation capability. Such test devices are relatively expensive and increase the cost of testing. The RF generator produces an RF modulated output signal at a desired attenuation level, e.g., −70 dBm, which is input to the RF port of the transceiver in place of the antenna. The data output of the transceiver DUT is input to the BER meter which functions to compute a BER result. The BER result is used to determine whether the chip passes or should be discarded.

In testing RFICs, one of the most crucial parameters to be measured is the dynamic range of the input signal. This dynamic range is the maximum and minimum input power levels at which the radio still exhibits acceptable performance. These measurements are typically performed at the system level using a BER measurement such as described above. Other system parameters may also be considered including the effects of blockers and interferers, as well as input frequency error effects, all of which can also be characterized with a BER test. Prior art testing requires that the RF tester provide a modulated source (whether digital or analog) which is subsequently input to the front end of the receiver IC. The data output from the receiver is then compared to the original data using external hardware or software means to provide a BER measurement.

A disadvantage of the prior art test scheme described above is that the RF test equipment needed to perform such tests is typically very expensive, driving up the overall cost of manufacturing the chip which in turn decreases profit margins. In particular, the requirement to provide a modulated RF test signal at the appropriate power level is burdensome in terms of cost and measurement time due to the need to employ expensive RF generators with built-in modulation capability. In addition, the measurement time required by such external RF capable test equipment is relatively long. A long measurement time limits the throughput of integrated circuit (IC) production and increases testing costs.

It is therefore desirable to be able to test the performance of an integrated RF transceiver chip, in particular the receiver front end, which due to its analog nature tends to have performance variances resulting from variances in the manufacturing process, using very low cost test equipment and which requires short measurement times so as not to limit the throughput rate of IC production and reduce production costs.

SUMMARY OF THE INVENTION

The present invention solves the problems of the prior art by providing an on-chip receiver sensitivity test mechanism for use in an integrated RF transmitter wherein the transmitter and the receiver share the same oscillator. The mechanism of the present invention obviates the need to use expensive RF test equipment with built-in modulation and BER measurement capabilities and instead permits the use of very low cost external RF test equipment to test an integrated RF receiver. A relatively small amount of additional circuitry, however, is required to realize the test mechanism on the integrated circuit. Further, this additional circuitry, software or a combination of the two would typically only be used once at the time of IC production testing to verify performance of the receiver. In most cases, the additional chip real estate taken by the test mechanism circuitry, which is not used during normal operation of the chip, is more than offset by the savings in both test time and test cost since high cost RF test equipment is not needed and testing time is reduced.

A key feature of the present invention is that it takes advantage of already existing circuitry in the transceiver in performing sensitivity testing of the receiver. In particular, the modulation circuitry and the local oscillator, normally used to generate a modulated RF carrier during transmission, is used to generate the modulated test signal that otherwise must be provided by expensive external RF test equipment having modulation capability. The modulated local oscillator signal is then mixed with an unmodulated continuous wave (CW) RF signal applied to the RF in/out terminal of the transceiver to generate a modulated IF signal which is then processed by the remainder of the receiver circuit. A consequence of modulating the oscillator already present on-chip with the test data is that the external RF test generator only need provide an unmodulated CW RF signal to the RF input terminal of the chip. This requirement can be provided by relatively low cost RF generators, thus reducing the testing costs significantly.

The amplitude of the modulated signal at IF is determined by the amplitude of the external unmodulated CW RF signal applied to the chip. During testing, the amplitude is set to the desired test level, according to the test performed (e.g., the sensitivity level specified in the device's specifications for a sensitivity test, or the maximum allowed input level for a dynamic range test). Note that the same modulated IF signal is produced as would be produced using the prior art testing scheme, wherein a modulated RF input signal is applied at the RF in/out terminal of the transceiver and an unmodulated LO signal is generated on-chip. The output of the mixer is the same in the two cases since the mixer obeys the associative law of addition in frequency, in that it does not care which signal is applied to which input, assuming lower side injection is applied, i.e. setting the LO below the input frequency by an amount equal to the IF (otherwise the two cases may differ by a simple spectral inversion, which may be compensated for by means of a simple inverter).

The modulated signal at IF is processed by the remainder of the receiver chain, wherein the signal is digitized and demodulated. The recovered Rx data bits (i.e. with bit errors) are compared by a BER meter or counter within the chip against the known test sequence used, and a BER reading is generated. The BER reading is output to an external tester which establishes a pass/fail indication for the test, or is alternatively read into an on-chip processor or controller adapted to execute a testing sequence for production testing. Once testing is complete, the processor or controller memory may be reloaded with software that would be used in the transceiver's normal operation, thus eliminating the need to allocate dedicated memory space for the testing routines.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention, a method of testing receiver sensitivity, dynamic range and other BER performance related measures in a frequency modulated transceiver incorporating a local oscillator shared between a transmitter and a receiver, the method comprising the steps of first applying a test sequence to a modulation input of the local oscillator so as to generate a modulated local oscillator signal therefrom, second applying an unmodulated continuous wave (CW) radio frequency (RF) signal to an RF port of the transceiver, wherein the amplitude of the unmodulated CW RF signal is set to a desired test level, mixing the unmodulated CW RF signal with the modulated local oscillator signal to generate an IF signal therefrom, the IF signal subsequently processed by the receiver and comparing data output of the receiver with the test sequence and generating a bit error rate (BER) result therefrom.

There is also provided in accordance with the present invention, an apparatus for testing receiver sensitivity in a frequency modulated transceiver incorporating a local oscillator shared between a transmitter and a receiver comprising first means for applying a test sequence to a modulation input of the local oscillator so as to generate a modulated local oscillator signal therefrom, second means for applying an unmodulated continuous wave (CW) radio frequency (RF) signal to an RF port of the transceiver, wherein the amplitude of the unmodulated CW RF signal is set to a desired test level, means for mixing the unmodulated CW RF signal with the modulated local oscillator signal to generate an IF signal therefrom, the IF signal subsequently processed by the receiver and means for comparing data output of the receiver with the test sequence and generating a bit error rate (BER) result therefrom.

There is further provided in accordance with the present invention, an apparatus for testing receiver sensitivity in a frequency modulated transceiver incorporating a local oscillator shared between a transmitter and a receiver comprising a sequence generator coupled to a modulation input of the local oscillator, the sequence generator adapted to generate and apply a test sequence to the local oscillator, the local oscillator adapted to output a modulated test signal in response thereto, means for applying an unmodulated continuous wave (CW) radio frequency (RF) signal to an RF input of the receiver, wherein the amplitude of the unmodulated CW RF signal is set to a desired test level, the receiver comprising a mixer adapted to mix the unmodulated CW RF signal with the modulated local oscillator signal so as to generate an IF signal therefrom, wherein the IF signal subsequently processed by the receiver and a bit error rate (BER) meter coupled to an output of the receiver and adapted to compare data output of the receiver with the test sequence to yield a bit error rate result therefrom.

There is also provided in accordance with the present invention, a method of testing receiver sensitivity in a transceiver chip incorporating a local oscillator (LO) shared between a transmitter and a receiver, test sequence generator and bit error rate (BER) meter, the method comprising the steps of setting the receiver to a receive mode of operation and enabling modulation of the local oscillator, selecting the output of the test sequence generator as the data source for modulation of the local oscillator and tuning the local oscillator to generate a desired RF channel, setting an external radio frequency (RF) generator to a desired frequency channel and power level, resetting the BER meter and performing test sequence based error counting so as to generate a BER reading once complete and comparing a BER reading with a specified threshold and passing the chip if the BER reading is less than the threshold, and failing the chip otherwise.

There is further provided in accordance with the present invention, a method of testing and characterizing receiver sensitivity in a transceiver chip incorporating a local oscillator (LO) shared between a transmitter and a receiver, test sequence generator and bit error rate (BER) meter, the method comprising the steps of setting the receiver to a receive mode of operation and enabling modulation of the local oscillator, selecting the output of the test sequence generator as the data source for modulation of the local oscillator and tuning the local oscillator to generate a desired RF channel, sweeping the amplitude setting of an external radio frequency (RF) generator over a predetermined range and measuring BER performance at a plurality of amplitudes, generating a performance curve of BER versus input RF power level and passing the chip if the measured BER performance is better than a minimum specified performance, and failing the chip otherwise.

There is also provided in accordance with the present invention, a method of testing the highest possible RF input level of a receiver in a transceiver chip incorporating a local oscillator (LO) shared between a transmitter and a receiver, test sequence generator and bit error rate (BER) meter, the method comprising the steps of setting the receiver to a receive mode of operation and enabling modulation of the local oscillator, selecting the output of the test sequence generator as the data source for modulation of the local oscillator and tuning the local oscillator to generate a desired RF channel, setting an external radio frequency (RF) generator to a desired frequency channel and power level, resetting the BER meter and performing test sequence based error counting so as to generate a BER reading once complete and comparing a BER reading with a specified threshold and passing the chip if the BER reading is less than the threshold, and failing the chip otherwise.

There is further provided in accordance with the present invention, a method of testing the tolerance of a receiver to input frequency errors in a transceiver chip incorporating a local oscillator (LO) shared between a transmitter and a receiver, test sequence generator and bit error rate (BER) meter, the method comprising the steps of setting the receiver to a receive mode of operation and enabling modulation of the local oscillator, selecting the output of the test sequence generator as the data source for modulation of the local oscillator and tuning the local oscillator to generate a desired RF channel, setting an external radio frequency (RF) generator to a desired power level and frequency channel with a deliberate frequency offset equal to the amount of error defined as tolerable in device's specifications and, resetting the BER meter and performing test sequence based error counting so as to generate a BER reading once complete and comparing a BER reading with a specified threshold and passing the chip if the BER reading is less than the threshold, and failing the chip otherwise.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
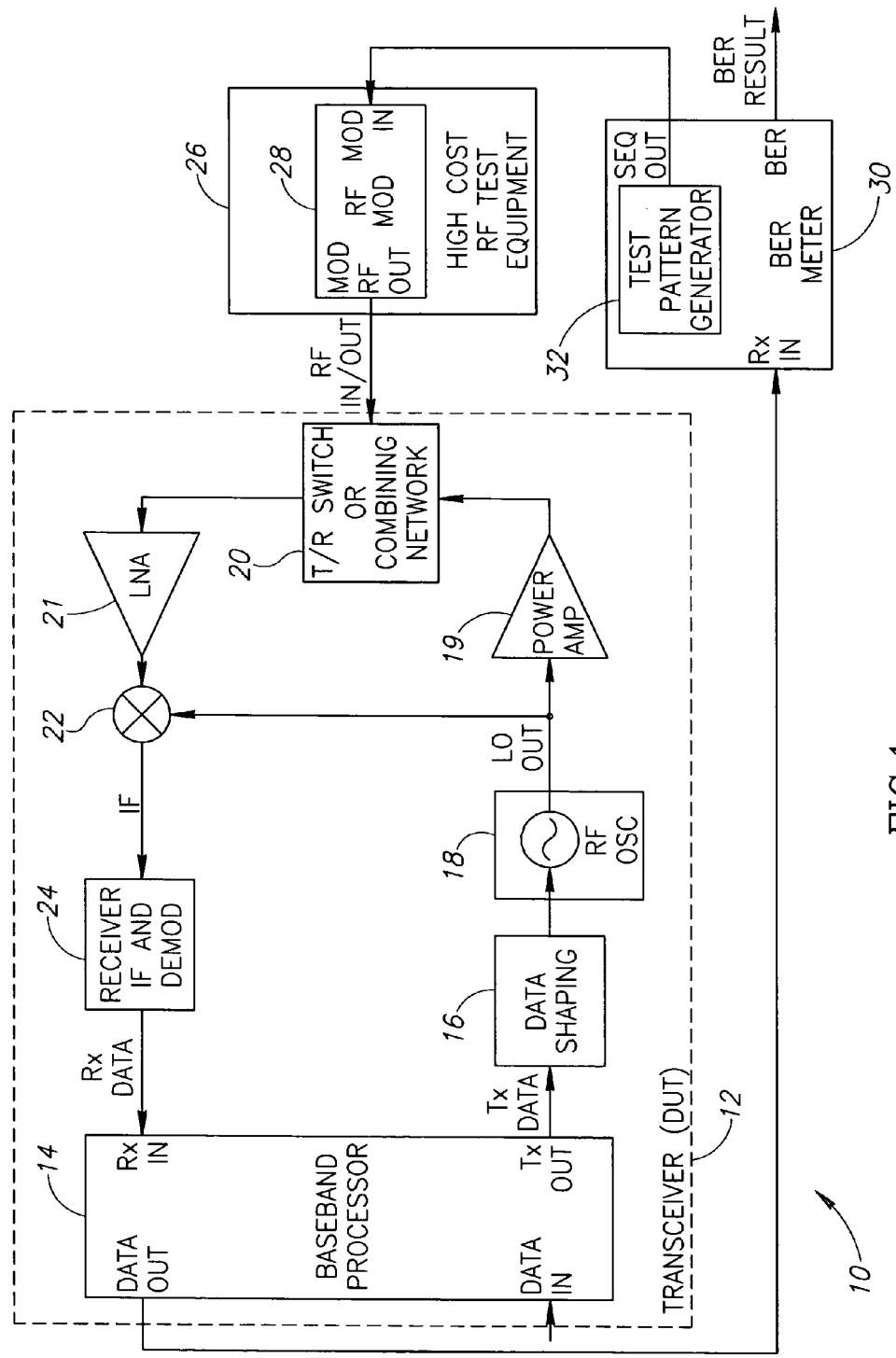
FIG. 1 is a block diagram illustrating an example prior art test scheme for testing the sensitivity of a receiver.

The following notation is used throughout this document.

| Term | Definition |
| --- | --- |
| ASIC | Application Specific Integrated Circuit |
| BIST | Built-in Self Test |
| BIT | Built-in Test |
| DC | Direct Current |
| DCO | Digitally Controlled Oscillator |
| DPLL | Digital Phase Locked Loop |
| DSP | Digital Signal Processor |
| DUT | Device Under Test |
| FCW | Frequency Command Word |
| FPGA | Field Programmable Gate Array |
| GSM | Global System for Mobile Communication |
| HDL | Hardware Description Language |
| IF | Intermediate Frequency |
| ISI | Intersymbol Interference |
| ISM | Industrial Scientific Medical |
| MNEC | Modulation Noise Estimation Circuit |
| MNEM | Modulation Noise Estimation Mechanism |
| nDCO | Normalized Digitally Controlled Oscillator |
| PC | Personal Computer |
| PLL | Phase Locked Loop |
| PN | Pseudorandom Number |
| RF | Radio Frequency |

DETAILED DESCRIPTION OF THE INVENTION

The present invention is an on-chip digital receiver test mechanism for use in an integrated RF transmitter wherein the transmitter and the receiver share the same oscillator. The mechanism of the present invention obviates the need to use expensive RF signal generator test equipment with built-in modulation capability and instead permits the use of very low cost external RF test equipment to test an integrated RF receiver. A relatively small amount of additional circuitry, however, is required to realize the test mechanism on the integrated circuit, unless this function is performed entirely in software, in which case no hardware resources would be needed.

In the case software is used for testing, the memory allocated for code storage may be reloaded with that of the normal operation, once the testing is complete, thereby obviating the need for dedicated memory allocation for the testing routines. The additional circuitry or software routines related with the test would typically only be used once at the time of IC production testing to verify performance of the receiver, although for some applications this may be useful for testing and maintenance whenever there seems to be degraded performance as a result of a fault that occurs after production (e.g., a cell phone that has been in use and is suspected after a while to have suffered some degradation in its reception sensitivity). In most cases, the additional chip real estate taken by the test mechanism circuitry, which is not used during normal operation of the chip, is more than offset by the savings in both test time and test cost since high cost RF test equipment is not needed.

To aid in understanding the principles of the present invention, the description is provided in the context of a transceiver adapted to comply with the Bluetooth standard. It is appreciated, however, that the invention is not limited to use with Bluetooth compliant devices but can be applied to devices adapted to comply with other standard as well, such as GSM. In addition, the invention is not limited to use with the frequency modulation scheme presented herein but is applicable to other digital and analog modulation schemes as well.

Figure 2:
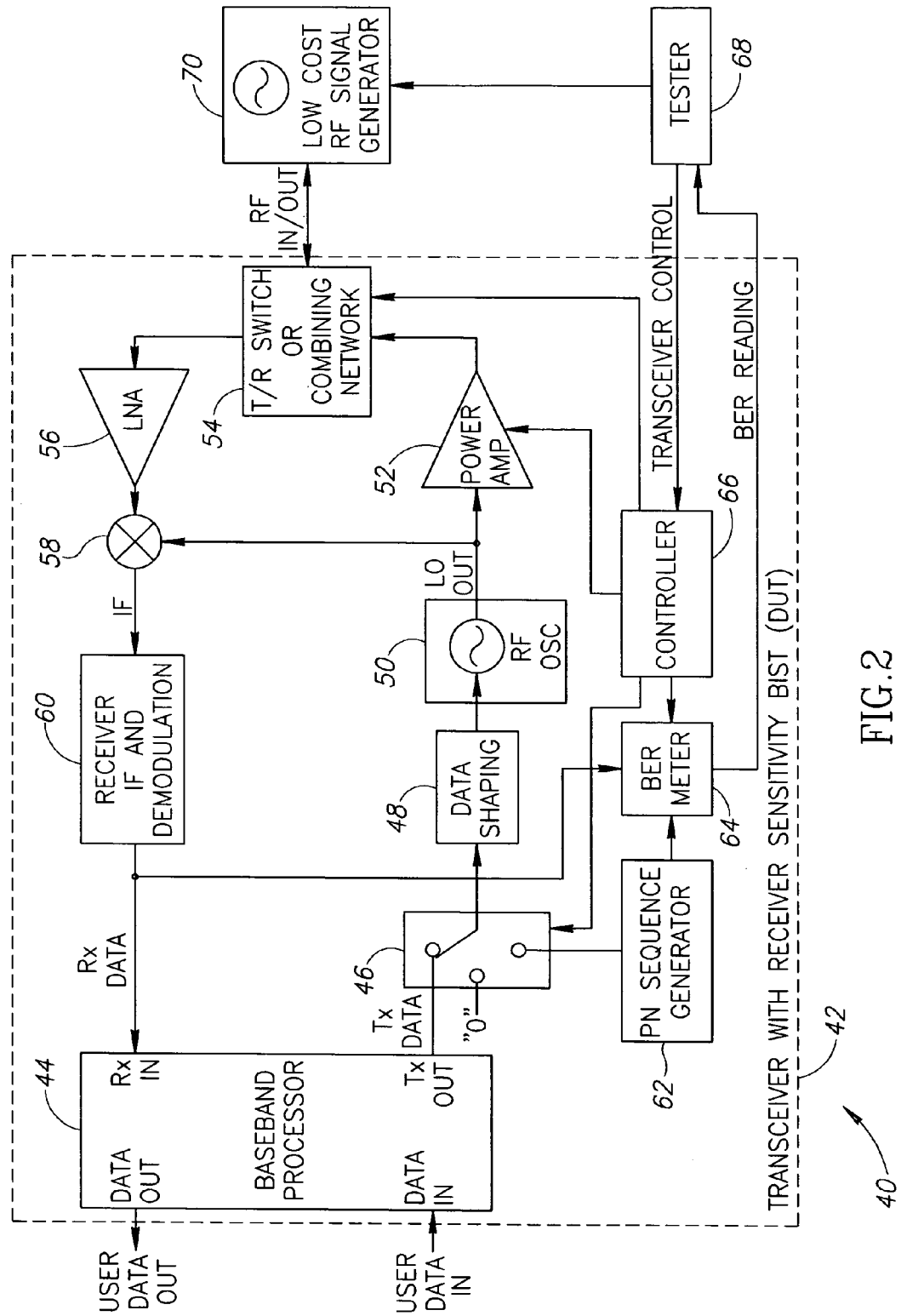
FIG. 2 is a block diagram illustrating an example embodiment of the on-chip receiver sensitivity test mechanism of the present invention.

A block diagram illustrating an example embodiment of the on-chip receiver sensitivity test mechanism of the present invention is shown in FIG. 2. The test scheme, generally referenced 40, comprises the transceiver with receiver sensitivity built-in self test (BIST) 42, i.e. the device under test (DUT) and external test equipment including a tester 68 and simple low cost RF signal generator 70. Note that the tester and RF generator may be combined into a single device. The transceiver 42 comprises a baseband processor 44, receiver sensitivity BIST circuitry and transmit and receive paths. The receiver sensitivity BIST circuits comprise test sequence generator 62, BER meter 64 and data selector switch 46, which is typically a digital multiplexer.

The transmit path comprises a data shaping circuit 48, shared RF oscillator 50, power amplifier 52 and T/R switch or combining network 54. When the transceiver is not in testing mode, the RF in/out terminal of the transceiver is normally connected to an antenna (not shown). For purposes of testing, the RF in/out terminal is connected to the low cost RF signal generator 70. The receive path comprises a low noise amplifier (LNA) 56, mixer 58 and receiver IF and demodulator 60.

The baseband processor comprises a user data in port, user data out port, Rx in port and Tx out port. When in transit mode, the receiver portion of the transceiver is shut down and the Tx data is input to the data shaping circuit, the output of which is input to the modulation input of the RF oscillator 50. Note that the RF oscillator is shared between both the transmitter and the receiver. The output of the oscillator is input to the power amplifier, the output of which appears at the RF in/out terminal via the T/R switch or combiner network normally connected to the antenna (not shown) when not in test mode.

When in receive mode, the signal at the RF in/out terminal is input to the LNA. Under normal operation, the RF input signal received from the antenna is a signal modulated in accordance with the particular implementation, e.g., Bluetooth modulation. The output of the LNA is input to one of the two inputs of the mixer. During reception, the oscillator is configured to run at the appropriate center frequency without any modulation input (i.e. the data selector switch 46 may be set to the "0" position, representing not a sequence of zeros but the absence of a modulating signal, such that the oscillator produces a non-modulated RF signal at the desired LO frequency). The non-modulated signal output of the oscillator comprises the second input to the mixer. The IF signal output of the mixer is input to the remainder of the receiver chain and the Rx data output is input to the baseband processor.

A key feature of the present invention is that while in test mode the test mechanism takes advantage of already existing circuitry in the transceiver in performing sensitivity testing of the receiver. In particular, the data shaping circuitry 48 and the RF oscillator 50, used during transmission to digitally modulate the local oscillator (LO), are used to generate the modulated test signal that otherwise must be provided by expensive external RF test equipment having modulation capabilities. The modulated local oscillator signal is then mixed with an unmodulated continuous wave (CW) RF signal applied to the RF in/out terminal of the transceiver to generate a modulated IF signal which is then processed by the remainder of the receiver circuit as it if were a product of a normal modulated RF input signal compliant with the relevant standard (e.g., a Bluetooth modulated signal in the 2.4 GHz ISM band) and a non-modulated LO signal. A consequence of modulating the oscillator already present on-chip with the test data is that the external RF test generator only need provide an unmodulated CW RF signal to the RF input terminal of the chip. This requirement can be provided by relatively low cost RF generators. An RF generator with modulation capability and an external BER meter are now not required, thus reducing the testing costs significantly.

During testing, test sequence data is generated by the test sequence generator 62. The test sequence generator may be adapted to generate a pseudorandom number (PN) sequence or any other desired data pattern suitable for performing the receiver sensitivity tests. The test sequence pattern is routed to the data shaping circuit by appropriate configuration of the data selector switch 46. The data shaping circuit performs shaping of the digital data, in accordance with the targeted communications standard. Such shaping exists in many communications standards to improve the spectral qualities of the output transmit signal. In the case of Bluetooth and GSM, Gaussian shaping is performed. The actual type of shaping applied is not important with respect to the operation of the invention, however the complexity involved in creating it would need to be provided on-chip for the purpose of transmission anyway, but would not be required in the external test equipment by making use of the invention. Hence, for those modulation schemes where the shaping and/or modulation scheme may be proprietary (i.e. non standard) or of high complexity, traditionally requiring more expensive testing equipment, the invention would offer an even greater advantage.

The output of the data shaping circuit is used to modulate the RF oscillator. In the case of frequency modulation, the baseband signal at the filter's output translates to frequency deviations from the center frequency of the oscillator. Depending on the application, the oscillator may be adapted to generate a plurality of frequencies corresponding to different transmission channels. In a system compliant with the Bluetooth 1.1 specifications, for example, the oscillator would need to be able to produce 79 different carrier frequencies between 2402 MHz and 2480 MHz with a channel spacing of 1 MHz. During the test procedure, it is likely that the receiver performance would be confirmed at several but not all of these frequency channels, due to the desire to minimize testing time. In such case, it is assumed that the tester 68 can control not only the amplitude of the RF signal generator 70, but also its frequency, as illustrated by the control line between them shown in FIG. 2 (often realized using a GPIB parallel control interface).

The LO output signal drives one of the two inputs of the mixer. The CW RF signal produced by the external low cost RF signal generator is applied to the other mixer input after passing through the T/R switch or combiner network and the LNA. The output of the mixer is a modulated signal at IF. Note that typically, the IF signal is either a low IF or zero IF signal. The amplitude of this modulated signal is determined by the amplitude of the external unmodulated CW signal. During testing, the amplitude is set to the desired test level, e.g., the specified worst-case receiver sensitivity level, for the case of a receiver sensitivity test. Note that the same IF signal is produced as a result of this, as would be produced using the prior art testing scheme, wherein a modulated RF input signal is applied at the RF in/out terminal of the transceiver and an unmodulated LO signal is generated on-chip. The output of the mixer is the same in the two cases since the mixer obeys the associative law of addition, in that it does not care which signal is applied to which input, assuming lower side injection is applied. If upper side injection is used, an inverter is required within the receiver (e.g., a digital inversion applied on the recovered data) to correct for the spectral inversion caused by the upper side injection in the mixer in this case.

The modulated signal at IF is processed by the remainder of the receiver chain, particularly, the IF receiver 60, wherein the signal is digitized and demodulated. The recovered Rx data bits (i.e. with bit errors) output of the IF receiver 60 are compared to the expected (known) data bits of the testing sequence by the BER meter 64 within the chip, and a BER reading is generated. The BER reading is output to an external tester 68 which establishes a pass/fail indication for the test, or is alternatively used internally by an on-chip processor or controller which could run a sequence of various tests and then report a final pass/fail indication for the entire sequence of tests, with reception sensitivity possibly being only one of them. Techniques for performing BER measurement are well in the art. The BER meter may be adapted to perform any suitable BER measurement. For example, the BER meter may be adapted to receive both the original test sequence from the sequence generator 62 and the Rx data output of the receiver circuit 60. The BER meter, in this case, is adapted to provide a BER reading from a comparison of the two input data streams while compensating for the delay of the receiver.

Such compensation can be realized by means of a fixed or configurable delay unit, such that the same data sequence signal is reused to create a replica of it, produced by the delay unit, having the appropriate delay for the comparison in the error counter. Alternatively, when a $2^N-1$ length PN sequence is used, based on a specific known generating polynomial, a similar PN sequence generator may be used in the receiver, which would have an initialization phase during which N consecutive bits would be loaded into the shift register, and then a self-generating phase, in which the feedback defined by the generating polynomial would be enabled and would form the same structure of the test sequence generator used in the transmitter. Consequently, the receiver's sequence generator would be producing the necessary test sequence for comparison, having the correct delay, without having to determine the value of this delay. This is advantageous since the delay may vary as filter bandwidths and other affecting factors in the receiver may vary.

The tester 68 functions to provide control of the transceiver via commands or signals sent to the on-chip controller 66. The controller functions to provide configuration and control of the various circuits and components of the transceiver, including for example the data selector switch 46, BER meter, power amplifier and T/R switch.

During testing, the test pattern generator 32 in the BER meter is configured to generate a test sequence which is input to the modulation input of an RF generator with modulation capability. Such test devices are relatively expensive and increase the cost of testing. The RF generator produces an RF modulated output signal at a desired power level, e.g., −70 dBm, which is input to the RF port of the transceiver in place of the antenna. The data output of the transceiver DUT is input to the BER meter which functions to compute a BER result. The BER result is used to determine whether the chip passes or should be discarded.

As described hereinabove, an advantage of the present invention is that the need for external RF test equipment is obviated. In addition to the modulation of the test sequence being performed on-chip, the on-chip counting of the bit errors by the BER meter eliminates the need for external BER measurement equipment. Thus, the entire receiver sensitivity test, except for the external unmodulated CW RF signal, is performed within the chip. It is noted that the unmodulated CW RF signal can be provided by a low cost RF generator or test equipment. Such RF generators are readily commercially available and typically provide control of their various parameters (e.g., frequency and amplitude) via the widely used Hewlett Packard GPIB bus which permits the generator to be controlled by other equipment, such as the tester, having a GPIB interface as well.

Note that in an alternative embodiment, the low cost external RF generator is eliminated by the addition of a second oscillator on-chip. In this case, the second oscillator or some harmonic of it may be used to provide the unmodulated CW RF signal. Circuit means must be provided, however, that is capable of attenuating the unmodulated CW signal to the appropriate test levels. Note that the RF signal levels required for receiver sensitivity testing may be well below −70 dBm.

Two methods of performing receiver sensitivity tests using the test mechanism of the present invention are presented below. The first method is suitable for transceivers wherein the receiver is tested for a single input amplitude, thus consuming the minimal testing time. The second method is suitable for testing the receiver over a range of input signal levels, which would consume more time. This second method is suitable for characterization of a receiver at varying levels of input power. Note that these methods are intended for frequency modulation based transceivers such as those designed for Bluetooth, GSM, etc. Note also that the commands indicated in the method are generated by the tester or other suitable external test equipment and sent to the internal controller of the device under test.

Figure 3:
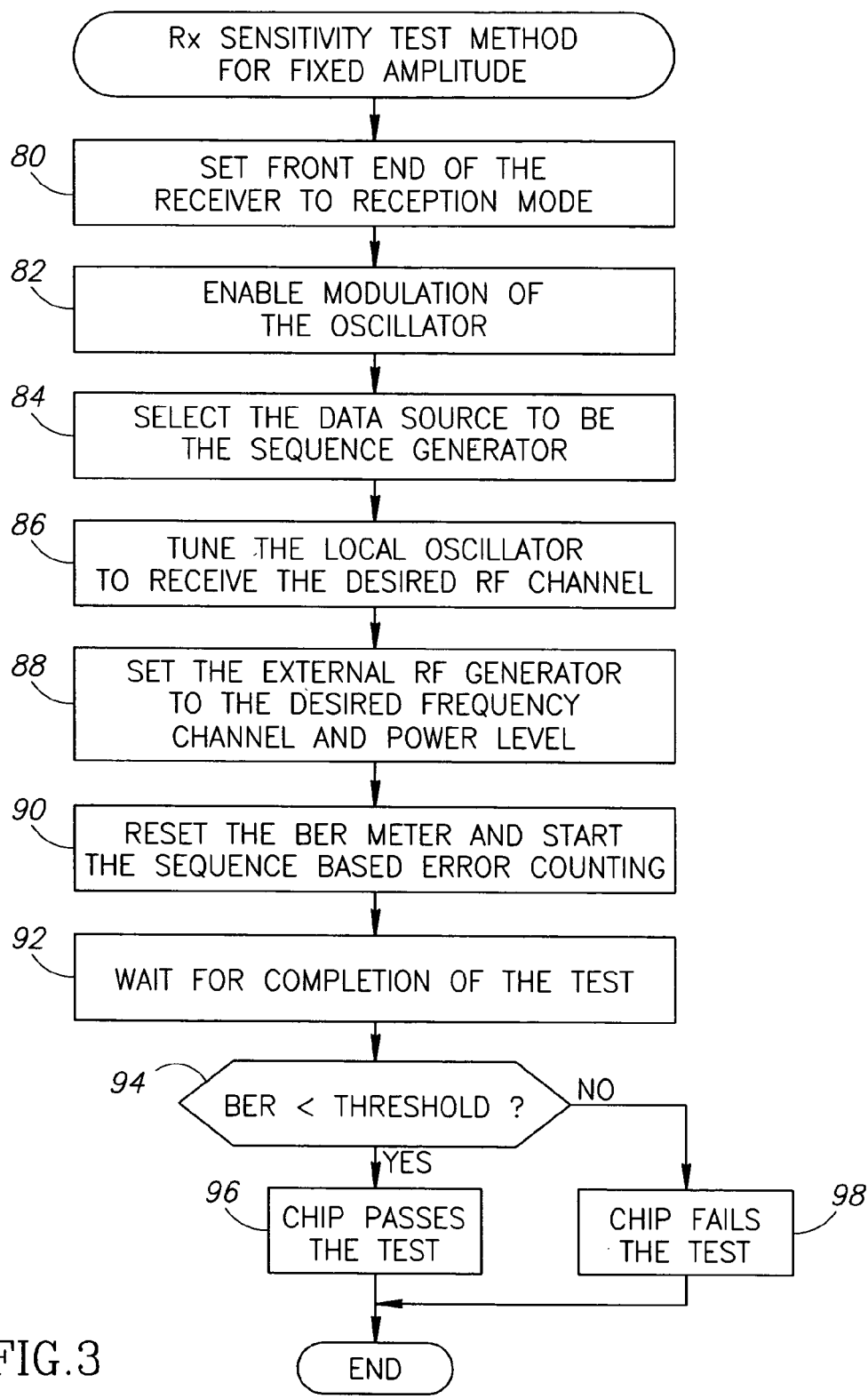
FIG. 3 is a flow diagram illustrating the receiver sensitivity test method for a fixed single amplitude.

A flow diagram illustrating an example receiver sensitivity test method for a transceiver with fixed amplitude is shown in FIG. 3. Initially, the front-end of the transceiver is set to reception mode (step 80). During this step, the power amplifier is disabled, the LNA and the mixer (i.e. downconverter) are enabled and the T/R switch is set to receive. Alternatively, the chip can be set to test mode which also performs these operations. Modulation of the local oscillator, e.g., voltage controlled oscillator (VCO) or digitally controlled oscillator (DCO) is then enabled such that the modulation input is not ignored (step 82). Note that normally, in receive mode, the LO is not modulated. Thus, this step is crucial to enable the on-chip generation of the modulated IF signal after downconversion by the mixer despite the RF input being unmodulated.

The data source is then configured to select the output of the test sequence generator (step 84). Note that normally, in transmit mode, data from the baseband processor is selected. The LO is then tuned to receive the desired RF channel for lower side injection (step 86). The external RF generator is then set to the desired frequency channel and power level (step 88). For example, the power level may be set to a defined sensitivity level or to a level shifted away from the defined level by +X dB or −Y dB, where X and Y are known and the expected performance is known from the receiver's BER vs. $E_b/N_o$ curve.

The BER meter or counter is reset and the PN sequence based error counting is started for a given number of bits, which are counted internally on-chip, thus obviating the need for this function to be performed by the external tester (step 90). Once the measurement has been completed (i.e. the specified number of bits have been read), the error counter is read (step 92). The BER reading is then compared to the threshold defined for this RF power level (step 94). If the BER reading is below the threshold (i.e. better than the threshold), the chip passes the test (step 96) and if it is above the threshold (i.e. worse than the threshold), the chip fails the test (step 98).

It is noted that a key purpose of the test mechanism of the present invention is to screen parts for receiver sensitivity in order that parts that do not meet receiver sensitivity requirements are not delivered to customers. Similarly, such a test may serve for the purpose of confirming the device's compliance with a specification for the maximum allowed signal level above which the BER observed at its output would exceed a certain tolerated maximum. It may also be used for tests related with the receiver's tolerance to RF input frequency errors or any other receiver performance measure that can be determined through a BER measurement with the setup described in the present invention. Another use of the test mechanism, however, is in the characterization of parts. In some applications, it is desirable to measure the sensitivity of the receiver to a plurality of different input signal levels, or to determine the BER vs. input signal level over a range of input signal levels. The invention can be used to provide such characterizations as well, as described in more detail below.

Figure 4:
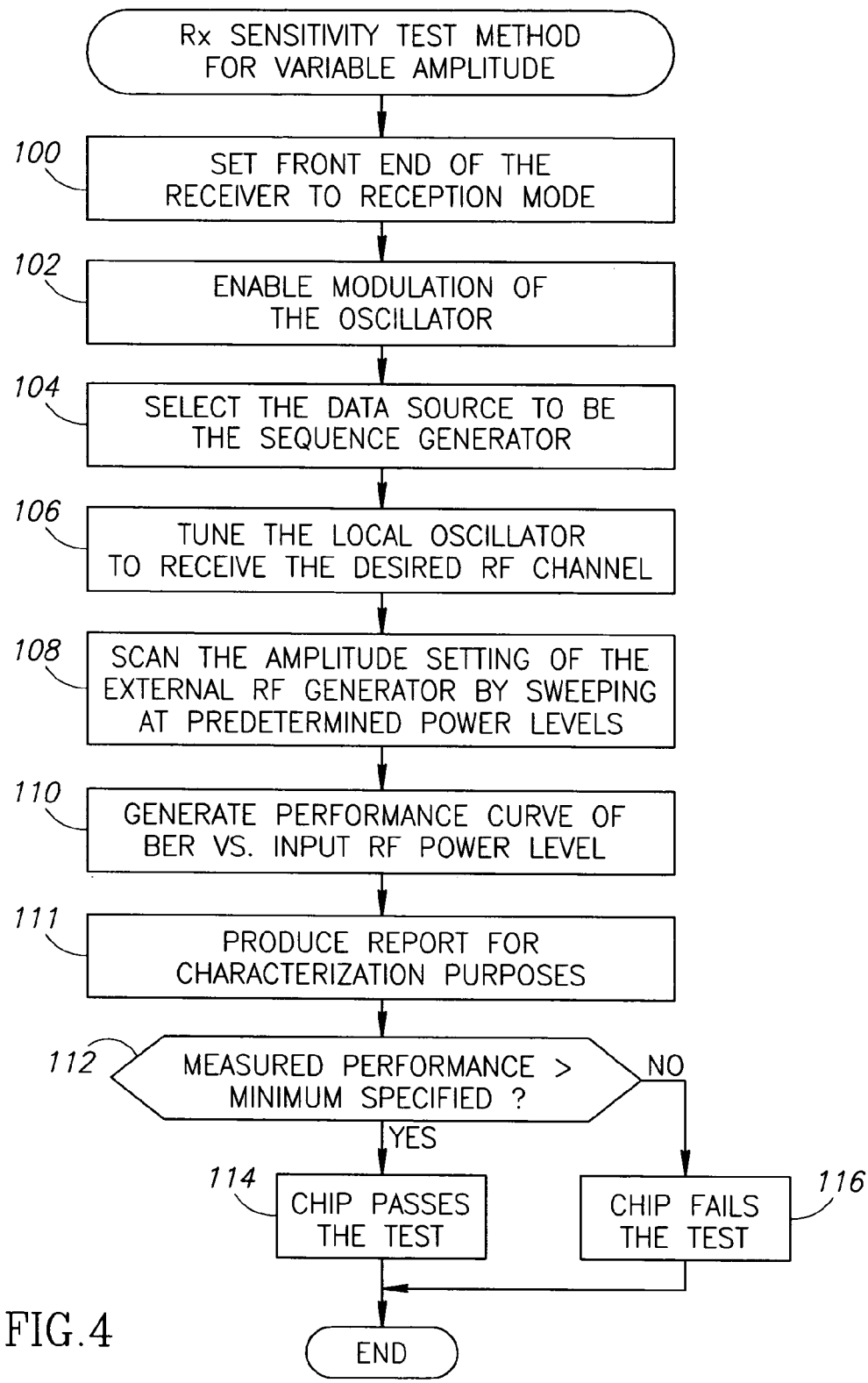
FIG. 4 is a flow diagram illustrating the receiver sensitivity test method for multiple input levels.

A flow diagram illustrating the receiver sensitivity test method for a transceiver with non-fixed amplitude frequency modulation is shown in FIG. 4. Initially, the front-end of the transceiver is set to reception mode (step 100). During this step, the power amplifier is disabled, the LNA and the mixer (i.e. downconverter) are enabled and the T/R switch is set to receive. Alternatively, the chip can be set to test mode which also performs these operations. Modulation of the local oscillator, e.g., voltage controlled oscillator (VCO) or digitally controlled oscillator (DCO) is then enabled such that the modulation input is not ignored (step 102). Note that normally, in receive mode, the LO is not modulated. Thus, this step is crucial to enable the on-chip generation of the modulated IF signal after downconversion by the mixer despite the RF input being unmodulated.

The data source is then configured to select the output of the test sequence generator (step 104). Note that normally, in transmit mode, data from the baseband processor is selected. The LO is then tuned to receive the desired RF channel for lower side injection (step 106). The amplitude setting of the external RF generator is scanned to go from a level sufficiently higher than a specified sensitivity level downwards until a marginal or just worse than marginal BER is reached for a particular sensitivity specification such as 0.1% errors (step 108). This is achieved by repeatedly resetting the BER meter and setting the RF amplitude of the external RF generator.

The multiple measurements are used to generate a performance curve of the BER versus input RF power level for which the criteria (e.g., 0.1% errors) was achieved. A report characterizing the sensitivity of the receiver is then produced for statistical analysis (step 111). The measured performance is then compared to a specified minimum (step 112). The part passes if the measured performance is better than the minimum specification (step 114) or fails if the measured performance is worse than the minimum specification (step 116).

Note that an advantage of the first method (FIG. 3) is its shorter duration. The reduced test time reduces testing costs. The input RF signal level does not need to be varied and can be fixed and set only once for all tests.

An advantage of the second method (FIG. 4) is that it enables characterization of the variance of sensitivity over process variations. Variances in the manufacturing process typically result in variances in parameters such as gains, noise figures and consequently dynamic range and sensitivity. Such testing is useful typically at the characterization stage shortly after the first production of a new design or when the production process is changed, but is less useful during mass production.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of testing receiver sensitivity, dynamic range and other BER performance related measures in a frequency modulated transceiver incorporating a local oscillator shared between a transmitter and a receiver, said method comprising the steps of:

first applying a test sequence to a modulation input of said local oscillator so as to generate a modulated local oscillator signal therefrom;

second applying an unmodulated continuous wave (CW) radio frequency (RF) signal to an RF port of said transceiver, wherein the amplitude of said unmodulated CW RF signal is set to a desired test level;

mixing said unmodulated CW RF signal with said modulated local oscillator signal to generate an IF signal therefrom, said IF signal subsequently processed by said receiver; and comparing data output of said receiver with said test sequence and generating a bit error rate (BER) result therefrom.

2. The method according to claim 1, wherein said step of mixing comprises the step of performing lower side injection.

3. The method according to claim 1, wherein said test sequence comprises a pseudorandom number (PN) sequence.

4. The method according to claim 1, wherein said unmodulated CW RF signal is provided by a low cost external RF generator.

5. The method according to claim 1, wherein said step of comparing comprises the step of correlating said receiver output date with said test sequence.

6. The method according to claim 1, wherein said unmodulated CW RF signal is generated using a second local oscillator within said transceiver.

7. The method according to claim 1, adapted to be implemented in an Application Specific Integrated Circuit (ASIC).

8. The method according to claim 1, adapted to be implemented in a Field Programmable Gate Array (FPGA).

9. An apparatus for testing receiver sensitivity in a frequency modulated transceiver incorporating a local oscillator shared between a transmitter and a receiver, comprising:
first means for applying a test sequence to a modulation input of said local oscillator so as to generate a modulated local oscillator signal therefrom;
second means for applying an unmodulated continuous wave (CW) radio frequency (RF) signal to an RF port of said transceiver, wherein the amplitude of said unmodulated CW RF signal is set to a desired test level;
means for mixing said unmodulated CW RF signal with said modulated local oscillator signal to generate an IF signal therefrom, said IF signal subsequently processed by said receiver; and
means for comparing data output of said receiver with said test sequence and generating a bit error rate (BER) result therefrom.

10. The apparatus according to claim 9, wherein said means for mixing comprises means for performing either lower side injection without compensation means or upper side injection with compensation means to correct spectrum inversion.

11. The apparatus according to claim 9, wherein said test sequence comprises a pseudorandom number (PN) sequence.

12. The apparatus according to claim 9, wherein said unmodulated CW RF signal is provided by a low cost external RF generator.

13. The apparatus according to claim 9, wherein said means for comparing comprises means for correlating said receiver output data with said test sequence.

14. The apparatus according to claim 9, wherein said unmodulated CW RF signal is generated using a second local oscillator within said transceiver.

15. The apparatus according to claim 9, adapted to be implemented in software residing in on-chip processing means.

16. The apparatus according to claim 9, adapted to be implemented in an Application Specific Integrated Circuit (ASIC).

17. The apparatus according to claim 9, adapted to be implemented in a Field Programmable Gate Array (FPGA).

18. An apparatus for testing receiver sensitivity in a frequency modulated transceiver incorporating a local oscillator shared between a transmitter and a receiver, comprising:
a sequence generator coupled to a modulation input of said local oscillator, said sequence generator adapted to generate and apply a test sequence to said local oscillator, said local oscillator adapted to output a modulated test signal in response thereto;
means for applying an unmodulated continuous wave (CW) radio frequency (RF) signal to an RF input of said receiver, wherein the amplitude of said unmodulated CW RF signal is set to a desired test level;
said receiver comprising a mixer adapted to mix said unmodulated CW RF signal with said modulated local oscillator signal so as to generate an IF signal therefrom, wherein said IF signal subsequently processed by said receiver; and
a bit error rate (BER) meter coupled to an output of said receiver and adapted to compare data output of said receiver with said test sequence to yield a bit error rate result therefrom.

19. The apparatus according to claim 18, wherein said mixer is adapted to perform lower side injection.

20. The apparatus according to claim 18, wherein said test sequence comprises a pseudorandom number (PN) sequence.

21. The apparatus according to claim 18, wherein said unmodulated CW RF signal is provided by a low cost external RF generator.

22. The apparatus according to claim 18, wherein said unmodulated CW RF signal is generated using a second local oscillator within said transceiver.

23. The apparatus according to claim 18, wherein BER meter comprises means for correlating said receiver output data with said test sequence.

24. The apparatus according to claim 18, wherein BER meter comprises means for determining whether the transceiver under test passes or fails based on said BER result.

25. The apparatus according to claim 18, adapted to be implemented in software adapted to be executed on on-chip processing means.

26. The apparatus according to claim 18, adapted to be implemented in an Application Specific Integrated Circuit (ASIC).

27. The apparatus according to claim 18, adapted to be implemented in a Field Programmable Gate Array (FPGA).

28. A method of testing receiver sensitivity in a transceiver chip incorporating a local oscillator (LO) shared between a transmitter and a receiver, test sequence generator and bit error rate (BER) meter, said method comprising the steps of:
setting said receiver to a receive mode of operation and enabling modulation of said local oscillator;
selecting the output of said test sequence generator as the data source for modulation of said local oscillator and tuning said local oscillator to generate a desired RF channel;
setting an external radio frequency (RF) generator to a desired frequency channel and power level;
resetting said BER meter and performing test sequence based error counting so as to generate a BER reading once complete; and
comparing a BER reading with a specified threshold and passing said chip if said BER reading is less than said threshold, and failing said chip otherwise.

29. A method of testing and characterizing receiver sensitivity in a transceiver chip incorporating a local oscillator (LO) shared between a transmitter and a receiver, test sequence generator and bit error rate (BER) meter, said method comprising the steps of:
  setting said receiver to a receive mode of operation and enabling modulation of said local oscillator;
  selecting the output of said test sequence generator as the data source for modulation of said local oscillator and tuning said local oscillator to generate a desired RF channel;
  sweeping the amplitude setting of an external radio frequency (RF) generator over a predetermined range and measuring BER performance at a plurality of amplitudes;
  generating a performance curve of BER versus input RF power level; and
  passing said chip if said measured BER performance is better than a minimum specified performance, and failing said chip otherwise.

30. A method of testing the highest possible RF input level of a receiver in a transceiver chip incorporating a local oscillator (LO) shared between a transmitter and a receiver, test sequence generator and bit error rate (BER) meter, said method comprising the steps of:
  setting said receiver to a receive mode of operation and enabling modulation of said local oscillator;
  selecting the output of said test sequence generator as the data source for modulation of said local oscillator and tuning said local oscillator to generate a desired RF channel;
  setting an external radio frequency (RF) generator to a desired frequency channel and power level;
  resetting said BER meter and performing test sequence based error counting so as to generate a BER reading once complete; and
  comparing a BER reading with a specified threshold and passing said chip if said BER reading is less than said threshold, and failing said chip otherwise.

31. A method of testing the tolerance of a receiver to input frequency errors in a transceiver chip incorporating a local oscillator (LO) shared between a transmitter and a receiver, test sequence generator and bit error rate (BER) meter, said method comprising the steps of:
  setting said receiver to a receive mode of operation and enabling modulation of said local oscillator;
  selecting the output of said test sequence generator as the data source for modulation of said local oscillator and tuning said local oscillator to generate a desired RF channel;
  setting an external radio frequency (RF) generator to a desired power level and frequency channel with a deliberate frequency offset equal to the amount of error defined as tolerable in device's specifications and;
  resetting said BER meter and performing test sequence based error counting so as to generate a BER reading once complete; and
  comparing a BER reading with a specified threshold and passing said chip if said BER reading is less than said threshold, and failing said chip otherwise.

* * * * *